United States Patent
Niu et al.

(10) Patent No.: US 7,584,406 B2
(45) Date of Patent: *Sep. 1, 2009

(54) LDPC CONCATENATION RULES FOR IEEE 802.11N SYSTEM WITH PACKETS LENGTH SPECIFIC IN OCTETS

(75) Inventors: Huaning Niu, Santa Clara, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 545 days.

This patent is subject to a terminal disclaimer.

(21) Appl. No.: 11/313,906

(22) Filed: Dec. 20, 2005

(65) Prior Publication Data

US 2007/0143656 A1    Jun. 21, 2007

(51) Int. Cl.
*H03M 13/03* (2006.01)
(52) U.S. Cl. ...................................... 714/790
(58) Field of Classification Search ................. 714/746, 714/790, 800, 375, 260
See application file for complete search history.

(56) References Cited

U.S. PATENT DOCUMENTS

| | | | |
|---|---|---|---|
| 6,633,856 B2 | 10/2003 | Richardson et al. | |
| 6,718,508 B2 | 4/2004 | Lodge et al. | |
| 6,789,227 B2 | 9/2004 | De Souza et al. | |
| 6,847,678 B2 | 1/2005 | Berezdivin et al. | |
| 6,895,547 B2 | 5/2005 | Eleftheriou et al. | |
| 7,002,900 B2 | 2/2006 | Walton et al. | |
| 7,072,289 B1* | 7/2006 | Yang et al. | 370/208 |
| 7,173,978 B2 | 2/2007 | Zhang et al. | |
| 7,178,080 B2 | 2/2007 | Hocevar | |
| 7,213,197 B2 | 5/2007 | Jacobsen et al. | |
| 7,260,055 B2* | 8/2007 | Wang et al. | 370/208 |
| 7,283,499 B2 | 10/2007 | Priotti et al. | |
| 7,324,605 B2 | 1/2008 | Maltsev et al. | |
| 7,373,688 B2 | 5/2008 | Eroz et al. | |
| 7,418,043 B2 | 8/2008 | Shattil | |
| 7,526,717 B2 | 4/2009 | Kyung et al. | |
| 2002/0042899 A1 | 4/2002 | Tzannes et al. | |
| 2003/0126538 A1 | 7/2003 | Mejean et al. | |
| 2004/0098659 A1 | 5/2004 | Bjerke et al. | |
| 2005/0283707 A1 | 12/2005 | Sharon et al. | 714/752 |
| 2006/0036923 A1 | 2/2006 | Hedberg et al. | |
| 2006/0087961 A1 | 4/2006 | Chang et al. | |
| 2006/0123241 A1 | 6/2006 | Martinian et al. | |
| 2006/0123277 A1 | 6/2006 | Hocevar et al. | 714/790 |
| 2006/0140294 A1 | 6/2006 | Hottinen et al. | |
| 2007/0022352 A1 | 1/2007 | Eroz et al. | |
| 2007/0041458 A1* | 2/2007 | Hocevar et al. | 375/260 |

(Continued)

OTHER PUBLICATIONS

Barton, Melbourne Unequal error protection for wireless ATM applications, 1996, IEEE, p. 1911-1915.*

(Continued)

*Primary Examiner*—Shelly A Chase
(74) *Attorney, Agent, or Firm*—Kenneth L. Sherman, Esq.; Michael Zarrabian, Esq.; Myers Andras Sherman LLP

(57) ABSTRACT

An improved LDPC encoding with concatenation rule and code size with packet lengths specified in octets is provided. The LDPC block size is selected to be an integer number of OFDM tones. The concatenation rule is an improvement of the shortening and puncturing scheme for low data rate. The improvement is two fold. First, the code length is selected based on the number of transmitted information bits in octets (HTLENGTH). Second, it is determined whether one extra OFDM symbol padding should be added based on the number of shortening bits in the last codeword and the available padding bits in the last OFDM symbol.

28 Claims, 7 Drawing Sheets

U.S. PATENT DOCUMENTS

2007/0064828 A1    3/2007    Aldana et al. ............... 375/295
2007/0101229 A1    5/2007    Niu et al. .................... 714/752
2008/0256426 A1    10/2008   Reid et al.

OTHER PUBLICATIONS

Mujtaba, S.A., "TGn Sync Proposal Technical Specification," a contribution to IEEE 802.11 11-04-889r4, Mar. 2005.

Kose, C.; and Edwards, B., "WWiSE Proposal: High throughput extension to the 802.11 Standard," a contribution to IEEE 802.11, 11-05-0149r2, Mar. 2005.

Van Veen, B.D.; and Buckley, K.M., "Beamforming: a versatile approach to spatial filtering", ASSP Magazine, IEEE, vol. 5, Iss. 2, Apr., 1988, pp. 4-24.

R.G. Gallager, "Low density parity check codes", IRE Trans. Inform. Theory, Jan. 1962, vol. IT-8, pp. 21-28.

T.J. Richardson, et al., "Design of capacity-approaching irregular low-density parity-check codes", IEEE Transactions on Information Theory, Feb. 2001, pp. 619 —637, vol. 47, No. 2.

T. Zhang et al., "Joint (3, k)-regular LDPC code and decoder/encoder design", IEEE Transactions on Signal Processing, Apr. 2004, pp. 1065-1079, vol. 52, No. 4.

Yeo et al., "Iterative decoder architectures", IEEE Communications Magazine, IEEE, Aug. 2003, pp. 132-140, vol. 41, No. 8.

T.J. Richardson et al., "Efficient encoding of low-density parity-check codes", IEEE Transactions on Information Theory, Feb. 2001, pp. 638 — 656, vol. 47, No. 2.

Chung et al., "Analysis of sum-product decoding of low-density parity-check codes using a Gaussian approximation", IEEE Transactions on Information Theory, Feb 2001, pp. 657 —670, vol. 47, No. 2.

Hu et al "Progressive edge-growth Tanner graphs", IEEE Globecom 2001, pp. 995-1001.

Mackay et al., "Near Shannon limit performance of low density parity check codes," Electronics Letters, Mar. 13, 1997, p. 457-458, vol. 33, No. 6.

Mujtaba, S.A., "TGN Sync Proposal Technical Specification," doc.: IEEE 802.11- 041889r0, Aug. 2004, pp. 1-136.

Livshitz, M., et al., "TGnSync- Shortening Puncturing_March 16," Nortel's PowerPoint presentation in LDPC subgroup a contribution for 802.11n, Mar. 16, 2005, pp. 1-14.

U.S. Office Action for U.S. Appl. No. 11/261,527 mailed on Jul. 10, 2008.

U.S. Office Action for U.S. Appl. No. 11/261,527 mailed on Mar. 16, 2009.

U.S. Office Action for U.S. Appl. No. 11/300,211 mailed on Mar. 9, 2009.

U.S. Office Action for U.S. Appl. No. 11/313,402 mailed on Aug. 15, 2008.

U.S. Office Action for U.S. Appl. No. 11/313,402 mailed on Jan. 29, 2009.

\* cited by examiner

LDPC CONCATENATION RULES FOR IEEE 802.11N SYSTEM WITH PACKETS LENGTH SPECIFIC IN OCTETS

FIELD OF THE INVENTION

The present invention related to wireless systems, and in particular, to structured Low Density Parity Check codes for wireless systems.

BACKGROUND OF THE INVENTION

Low Density Parity Check (LDPC) codes have recently attracted considerable attention owing to their capacity-approaching performance and low complexity iterative decoding. LDPC codes can be applied to a wide range of applications such as wireless communications, satellite communications and storage.

Currently, LDPC code is considered for in the high throughput wireless local area networks (WLAN), such as IEEE 802.11n, as an optional advanced code to improve system throughput. However, several issues need to be solved to match the LDPC code with unique system characteristics of different WLAN systems. First is the code size. Since LDPC code works better with longer code size, the code size should be selected as large as possible to ensure performance. However, since a WLAN system is a random access based system, the code size is limited by the SIFS (Short Inter-Frame Space) decoding budget. Therefore, the largest code size is limited to around 2K bits. Second, in high-throughput WLAN systems, the transmitted PPDU (Physical Protocol Data Unit) is large, which requires using several LDPC codewords. A method for concatenating the LDPC codeword within a PPDU is an important design issue. Since transported data packets can be any size from typically about 40 bytes up to 12000 bytes and larger, the WLAN system must be able to encode packets with variable lengths in a consistent manner. This consistency is required to ensure that the receiver always knows how to reconstruct the information data from the encoded transmitted data.

In a typical LDPC coded 802.11n WLAN system, the scrambled information bits are first zero padded to integer number of LDPC codeword, then coded with a systematic LDPC code. The coded codewords are parsed into different streams using either a bit parser or a group parser. The number of LDPC codewords within one packet is decided by the packet length and the concatenation rules.

Three concatenation rules exist. In the WWiSE approach, described in C. Kose and B. Edwards, "WWiSE Proposal: High throughput extension to the 802.11 Standard," a contribution to IEEE 802.11, 11-05-0149r2, March 2005 (incorporated herein by reference), only one codeword length and a shortening based scheme is utilized. This approach provides the simplest solution, but the worst performance in terms of extra OFDM padding efficiency. The TGn Sync approach described in S. A. Mujtaba, "TGn Sync Proposal Technical Specification," a contribution to IEEE 802.11 11-04-889r4, March 2005 (incorporated herein by reference), adopted two code lengths per rate. In order to minimize the extra OFDM symbol padding, shortening and puncturing are used for low data rate transmission. This approach chooses the code length based on the packet length, and always add 1 extra OFDM symbol padding at low rate transmission.

BRIEF SUMMARY OF THE INVENTION

The present invention provides an improved LDPC encoding with concatenation rule and code size with packet lengths specified in octets. In one embodiment of the present invention, the LDPC block size is selected to be an integer number of OFDM tones. A concatenation rule according to the present invention is an improvement of the shortening and puncturing scheme for low data rate. The improvement is two fold. First, the code length is selected based on the number of transmitted information bits in octets (HTLENGTH). Second, it is determined whether one extra OFDM symbol padding should be added based on the number of shortening bits in the last codeword and the available padding bits in the last OFDM symbol.

A shortening/puncturing concatenation rule according to the present invention can be used for low rate transmission, combined with shortening only scheme for high rate transmission. A shortening/puncturing concatenation rule according to the present can also be applied to all data rates for non-aggregation case where the HTLENGTH is specified in octets. As such, a concatenation rule according to the present invention can be applied to all data rates for both aggregate and non-aggregate cases as long as the HTLENGTH is specified in octets. Aggregation is a transmission scheme specified in MAC layer.

Accordingly, the present invention provides a simpler LDPC encoding approach wherein encoding parameters are determined using simple calculation without exhaustive search. The encoding according to the present invention is further more efficient than the WWiSE and TGn Sync approaches, and provides improved coding performance for very short packet compared with the current TGn Sync approach.

These and other features, aspects and advantages of the present invention will become understood with reference to the following description, appended claims and accompanying figures.

DETAILED DESCRIPTION OF THE INVENTION

Figure 1:
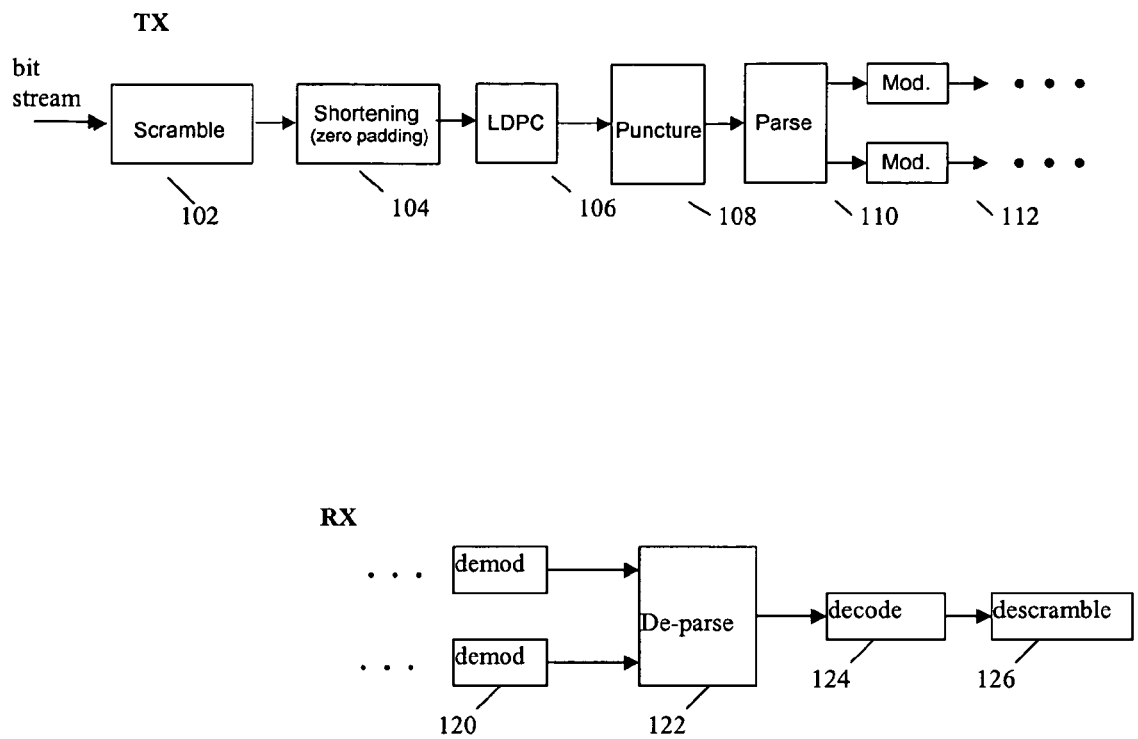
FIG. 1 shows a block diagram of an embodiment of an OFDM wireless transmission system which implements an embodiment of the present invention.

The present invention provides an improved LDPC encoding for MIMO wireless WLAN systems, with concatenation rule and code size with packet lengths specified in octets. In one embodiment of the present invention, the LDPC block size is selected to be an integer number of OFDM tones. A concatenation rule according to the present invention is an improvement of the shortening and puncturing scheme for low data rate. The improvement is two fold. First the code length is selected based on HTLENGTH. Second, it is determined whether one extra OFDM symbol padding should be added based on the number of shortening bits in the last codeword and the available padding bits in the last OFDM symbol.

To help in understanding the present invention, relevant details of the aforementioned approaches (i.e., WWiSE and TGn Sync (March 2005 version) referenced above) are discussed below. Based on the Modulation Coding Scheme (MCS), the following two parameters are defined and used in all the aforementioned approaches.

$N_{CBPS}=N_{BPSC}*N_{SD}*N_{SS}$, number of coded bits per OFDM symbol, $N_{DBPS}=N_{CBPS}*R$, number of information bits per OFDM symbol, wherein $N_{BPSC}$ is the number of coded bits per sub-carrier, $N_{SD}$ is the number of data sub-carriers, and $N_{SS}$ is the number of spatial streams.

WWiSE Approach

In this approach, each packet is encoded as an entity. In other words, the data boundary of a packet is respected by the encoder. Headers are encoded using a Viterbi decoder at R=½ and BPSK modulation. LDPC code length is 1944 for all four code rates. The process includes the steps of:

a) Compute the integer number of LDPC codewords to be transmitted, $L_1$, and the possible remainder $K_1$ as:

$L_1 = ceil((HTLENGTH \times 8 + 16)/1944/R)$, $K_1 = rem((HTLENGTH \times 8 + 16), 1944 \times R)$.

b) If $K_1 > 0$ compute the number of zeros for padding in order to encode the last codeword as $N_{P1} = 1944 \times R - K_1$. These bits will not be transmitted nor scrambled. If $K_1 > 0$, the last frame has an effective information frame (i.e., information frame excluding padded zeros) of size $K_1$, generally less than k. The last codeword includes a fixed number of parity bits equal to p=(1944-k). This implies the code rate for the last codeword is different from the overall target code rate and is given by:

$$\frac{K_1}{K_1 + (1944 - k)}.$$

c) Compute the number of coded bits to be transmitted (including the shortened codeword) as:

$$L_2 = \begin{cases} 1944 \times L_1, & K_1 = 0 \\ 1944 \times (L_1 - 1) + 1944 \times (1 - R) + K_1, & K_1 \neq 0 \end{cases}$$

d) Compute the integer number of MIMO-OFDM symbols $N_{S1}$ and the possible reminder $R_{S1}$:

$N_{S1} = ceil(L_2/N_{CBPS})$, $R_{S1} = rem(L_2, N_{CBPS})$.

e) If $R_{S1} > 0$, append $N_{P2}$ zeros to info bits in order to fill an integer number of MIMO-OFDM symbols:

$N_{P2} = N_{CBPS} - R_{S1}$.

f) The service field at the beginning of the resulting sequence is used to initialize a scrambler, which is then used to scramble the rest of the sequence including the zeros appended in step (g) below.

g) The resulting PSDU is then coded by the LDPC at the proper code rate (R) and block size (i.e., 1944 bits for all frames). The last codeword is encoded extending the info bits with $N_{P1}$ zeros; these $N_{P1}$ bits are not transmitted. The last $N_{P2}$ bits are not encoded.

TGn Sync Approach

Both shortening (reduction of number of bits in the information portion of the codeword) and puncturing (reduction of number of bits in the parity portion of the codeword) may be applied in order to ensure minimum overhead without degrading performance. If $N_{DBPS}$ is above a pre-defined threshold (high data rate), only shortening is used, which is similar to the WWiSE approach above. For low data rate transmission, both shortening and puncturing are applied. The procedure for encoding $N_{INFO\_BITS}$=HT-LENGTH*8 includes the following steps:

a) Encoding parameters computation

Determine the number of codewords, $N_{CWORDS}$, to transmit. For each of the codewords of length $N_1 \leq N$ determine amount of the information bits to encode, $K_1 \leq K$, as well as the number of parity check bits to be transmitted, $M_1 \leq M$ ($M_1 = N_1 - K_1$). This, in turn, determines by how many bits to shorten information portion of the codeword (number of zeros to pad the information field), $N_{PAD\_CW}$, as well as how many bits to puncture (remove bits from the parity portion of the codeword), $N_{PUNCTURE\_CW}$. In some cases it may be required that the last codeword has different number of data and parity bits, $K_{1\_LAST}$ and $M_{1\_LAST}$, respectively, (and consequently $N_{PAD\_CW\_LAST}$ and $N_{PUNCTURE\_CW\_LAST}$) than the other codewords.

--- if $N_{DBPS} \leq 216$
    $N_{OFDM}$ = ceiling($N_{INFO\_BITS}/N_{DBPS}$) + 1
    $N_{CWORDS}$ = ceiling($N_{OFDM}*N_{CBPS}/N$)
    $N_1$ = floor($N_{OFDM}*N_{CBPS}/N_{CWORDS}$)
    $K_1$ = ceiling($N_{INFO\_BITS}/N_{CWORDS}$)
    $N_{PAD\_CW} = K - K_1$
    $N_{PUNCTURE\_CW} = \max(0, (N-N_1-N_{PAD\_CW}))$
    if $N_{CWORDS} > 1$
        $K_{1\_LAST} = N_{INFO\_BITS} - K_1*(N_{CWORDS}-1)$
        $N_{PAD\_CW\_LAST} = K - K_{1\_LAST}$
        $N_{1\_LAST} = N_{OFDM}*N_{CBPS} - N_1*(N_{CWORDS}-1)$
        $N_{PUNCTURE\_CW\_LAST} =$
            $\max(0, (N-N_{1\_LAST} - N_{PAD\_CW\_LAST}))$
    end
else
    $N_{CWORDS}$ = ceiling($N_{INFO\_BITS}/K$)
    $K_1$ = ceiling($N_{INFO\_BITS}/N_{CWORDS}$)
    $N_{PAD\_CW} = K - K_1$
    if $N_{CWORDS} > 1$
        $K_{1\_LAST} = N_{INFO\_BITS} - K_1*(N_{CWORDS}-1)$
        $N_{PAD\_CW\_LAST} = K - K_{1\_LAST}$
    end
end

--- b) Last OFDM symbol padding field parameter computation

If the total number of coded bits, $N_{CODED\_BITS\_TOTAL}$, does not fit integer number of OFDM symbols, then additional padding (scrambled zeros) bits are added to the last OFDM symbol. Number of those bits, $N_{PAD\_OFDM\_LAST}$, is computed as follows:

--- if remainder($N_{CODED\_BITS\_TOTAL}, N_{CBPS}$) > 0
    $N_{PAD\_OFDM\_LAST} = N_{CBPS} -$
remainder($N_{CODED\_BITS\_TOTAL}, N_{CBPS}$)
    where $N_{CODED\_BITS\_TOTAL}$ is computed as follows:
if $N_{CWORDS} > 1$ -continued $$N_{CODED\_BITS\_TOTAL} = N_1*(N_{CWORDS}-1) + N_{1\_LAST}$$
else
$$N_{CODED\_BITS\_TOTAL} = N_1*N_{CWORDS}$$
end $N_{PAD\_OFDM\_LAST}$ zeros are appended to $N_{INFO\_BITS}$ from the input data buffer and passed to the scrambler.

Improved Concatenation Rule and Code Size

The present invention provides an improved concatenation rule and code size with packet lengths specified in octets. In one embodiment of the present invention, the LDPC block size is selected to be an integer number of OFDM tones. For example, with the TGn Sync 20 MHz specification (with 52 data tones per OFDM symbol), the code size is selected as 1872, 1248 and 624. Other examples according to the present invention are possible.

A concatenation rule according to the present invention is an improvement of the shortening and puncturing scheme for low data rate in the aforementioned TGn Sync approach. The improvement is two fold. First the code length is selected based on HTLENGTH. Second, it is determined whether one extra OFDM symbol padding should be added based on the number of shortening bits in the last codeword and the available padding bits in the last OFDM symbol. The steps when the HTLENGTH is specified in octets for low data rate are described below.

FIG. 1 shows a system architecture for an LDPC coded 802.11n system 100 which includes LDPC encoding with a concatenation rule according to an embodiment of the present invention. The system 100 includes a transmitter TX and a receiver RX. The transmitter TX includes a scrambler 102, a shortening unit 104, an LDPC encoder 106, a puncturer 108, a parser 110 and multiple modulators 112. The receiver RX includes multiple demodulators 120, a deparser 122, an LDPC decoder 124 and a descrambler 126.

The user information bits are passed through the scrambler 102 which randomizes the information bits, the shortening unit 104, and then encoded using a short to moderate block length Low Density Parity Check (LDPC) code in the LDPC Encoder 106. The encoded bits are then punctured in the puncturer 108 and pass through the round robin spatial parser 110 and then a constellation modulator 112 to form transmitted constellation point for each transmission path. The rest of the TX transmission chain follows the same as the convolutional codes and omitted here.

In the receiver side RX, the first part of the receiver chain is also the same as the convolutional codes, therefore omitted. The demodualtor 120 demodulates the detected symbols to soft bit information, the deparser 122 de-parses the bit stream, the decoder uses the soft bit metric and perform LDPC decoding, and the descrambler 126 descramble the decoded information bits and generates the same sequence as the source input.

The scrambled information bits are first zero padded to integer number of LDPC codeword, then coded with a systematic LDPC code. The coded codewords are parsed into different streams using either a bit parser (WWiSE proposal) or a group parser (TGn Sync proposal). The number of LDPC codewords within one packet is decided by the packet length and the concatenation rules.

Figure 2:
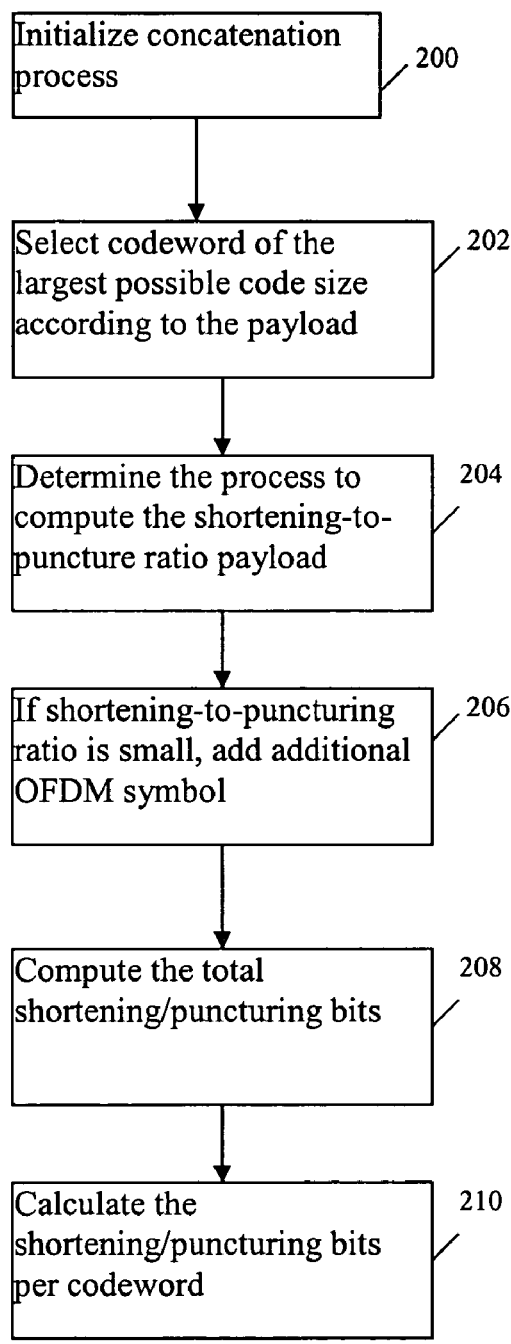
FIG. 2 shows a flow chart of an embodiment of the steps of calculating concatenation rule parameters in the system of FIG. 1.

An example of the concatenation rule includes two primary processes of: (1) choosing the appropriate code word from all the candidate code words based on the packet payload size, wherein the payload size is the number of transmitted information bits in octets, and (2) applying shortening and puncturing across all codewords within the packet to minimize the extra OFDM padding required while maintaining the coding performance. The flowchart in FIG. 2 shows an implementation of the above two primary processes, wherein steps 200 through 202 implement the first primary process, and steps 204 through 210 implement the second primary process, including:

Step 200: Initialize the concatenation process.

Step 202: Choose a codeword of the largest possible code size according to the payload, wherein choosing the largest possible code size essentially guarantees the best code performance since LDPC coding gain increases with increased code size (step 202).

Step 204: Determine criterion for applying shortening and puncturing and determine process to compute the shortening to puncture ratio (use of the shortening-to-puncturing ratio is discussed in commonly assigned patent application Ser. No. 11/261,527, filed Oct. 27, 2005, titled: "LDPC concatenation rules for IEEE 802.11n systems", incorporated herein by reference).

Step 206: Determine when extra OFDM symbols need to be padded to meet the criterion, wherein if shortening to puncturing ratio is small (e.g., smaller than 1.2), an additional OFDM symbol is added.

Step 208: Determine the exact number of bits to be shortened and to be punctured and compute the total shortening/puncturing bits.

Step 210: Calculate the shortening/puncturing bits per codeword.

A pseudo-code example implementation of the above steps is provided in Table 1 below, wherein:

Input includes:
Number of coded bits per OFDM symbol: $N_{CBPS}=N_{BPSC}*N_{SD}*N_{SS}$,
Number of information bits per OFDM symbol: $N_{DBPS}=N_{CBPS}*R$,
Number of transmitted information bits in octets: HTLENGTH.

Output includes:
Parameters used to encode and decode the LDPC codewords.

TABLE 1

Input:
    TXVECTOR-HTLENGTH (octets), DBPS, CBPS.
Select LDPC codeLength:
    # of codewords: NCodeWords = ceil(HTLENGTH*8/(Nmax*R));
    N = ceil(HTLENGTH*8 ./ R ./ (NCodeWords .* Ninc)) .*
Ninc;
    K = N*R, M=N*(1−R).
Calculate the SPRatio:
    # of shortening bits: N_shortening = mod((K −
mod((8*HTLENGTH), K)), K);
    # of padding bits within the last OFDM symbol: N_padding
= mod((CBPS − mod((8*HTLENGTH), DBPS)/R), CBPS)
    Define SPRatio = R*N_shortening /((1−R)*N_shortening − R
* N_padding_bits) /(1−R)*R.
Determine the transmitted OFDM symbols based on SPRatio
If SPRatio > 1.2
    N_OFDM_LDPC = ceil((8*HTLENGTH)./DBPS);
else
    N_OFDM_LDPC = ceil((8*HTLENGTH)./DBPS) + 1.
Determine the actual shortening and puncturing based on
N_OFDM_LDPC
    Lcword = floor(N_OFDM_LDPC .* CBPS ./ NCodeWords);
    N_padding = N .* NCodeWords .* R − (8*HTLENGTH);
    N_puncturing = max(0, (N − Lcword).*NCodeWords −
N_padding).

TABLE 1-continued

Calculate transmitted information bits per codeword Ks
    Ks =K − floor(N__padding / NCodeWords );
The information bits in the last codeword Ks__last
    Ks__last = HTLENGTH*8 − Ks × ( NCodeWords −1);
The transmitted parity bits per codeword Mp
    Mp = M-ceil(N__puncturing / CodeWords );
The parity bits in the last codeword Mp__last
    Mp__last = N__puncturing − Mp × (NCodeWords −1).
Calculate shortening and puncturing bits per codeword.
Encode by applying shortening and puncturing.

Figure 3:
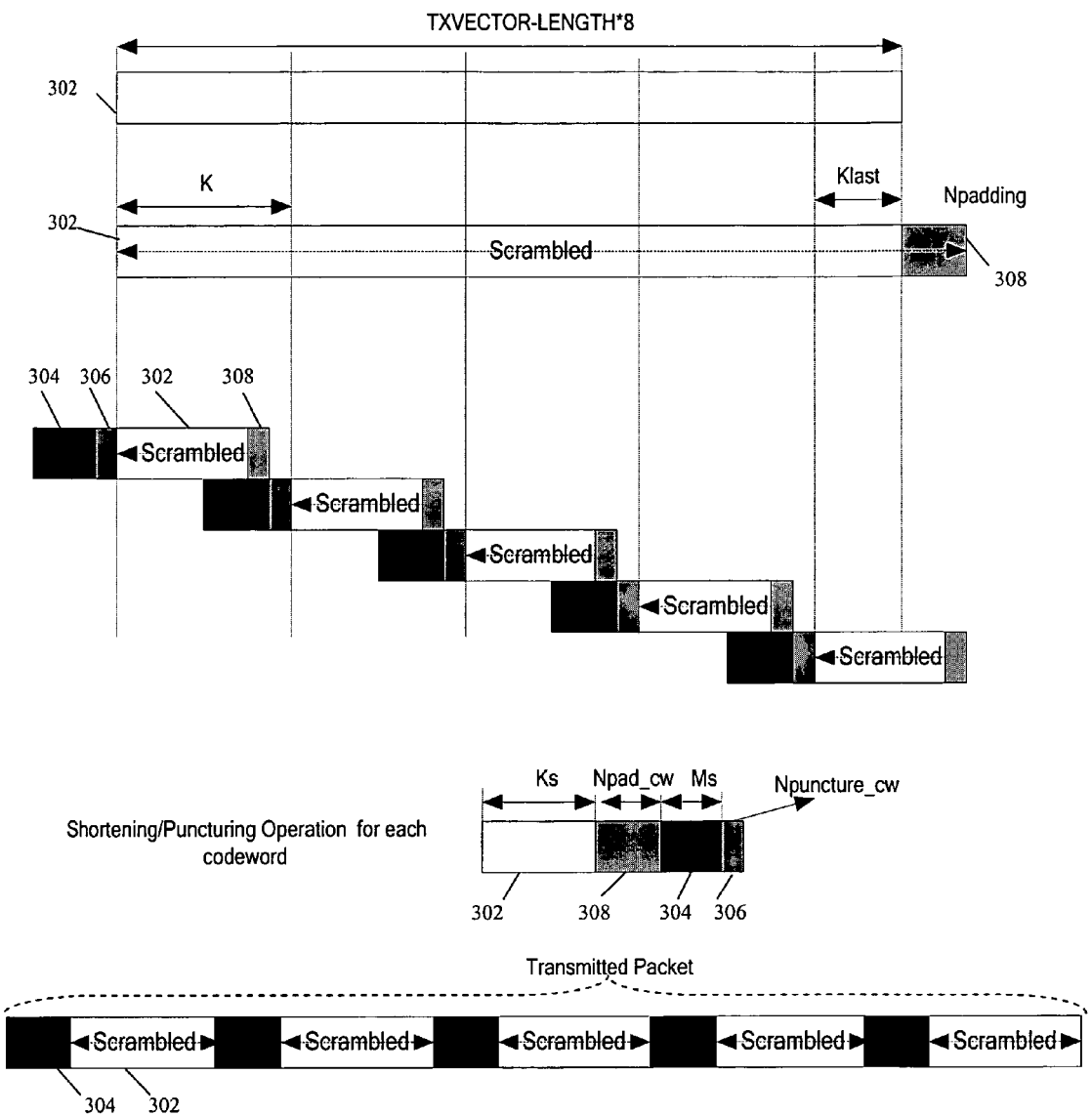
FIG. 3 shows a graphical illustration of the encoding process with shortening and puncturing in the system of FIG. 1.

FIG. 3 shows a diagrammatic example of an LDPC encoding procedure 300 according to an embodiment of the present invention. The blocks 302 represent the information bits. The blocks 304 represent the parity bits. The blocks 306 represent the punctured bits (not transmitted) and the blocks 308 represent the shortened bits (not transmitted).

The transmitter TX (FIG. 1) first calculates the required concatenation rule parameters before the shortening unit 104, as shown by the steps in flowchart of FIG. 2. Then the scrambler 102 in the transmitter TX scrambles the information bits. The scrambled information bits are cropped to blocks by the shortening unit 104, where each block has Ks bits except the last one. Each block is then zero padded to K bits length by the shortening unit 104 and encoded by the LDPC encoder 106. The zero padding bits, which are called shortening bits, are not transmitted. The first Mp parity bits are selected for transmission (Mp is the number of bits which are punctured, calculated in the Table 1 above).

The receiver RX (FIG. 1) also needs to calculate the concatenation rule parameters in the decoder 124 using the same steps as in FIG. 2. The decoding procedure in the decoder 124 of the receiver RX is the inverse of the encoding procedure. The receiver RX crops the received packet into blocks with Ks+Ms bits except the last one with Ks_last+Ms_last bits. Then the decoder 124 pads K-Ks shortening bits at the corresponding positions with the soft metric=Threshold, because all the shortening bits are zero. The Threshold is a fixed point implementation parameter. When implementing the decoding algorithm in fixed point, we need to use a fixed maximum value to represent the largest possible input. For example, when using 7 bits implementation, the highest value is 127. Then the threshold is 127.

The decoder 124 also inserts M-Ms parity bits with soft metric=0 at the corresponding puncturing position. These N bits soft metric are fed into the LDPC decoder 124. The Ks information bits are selected from the decoded codeword and form the packet. The HTLENGTH information bits are finally descrambled.

FIGS. 4-7 show example simulation results comparing performance efficiency of LDPC encoding according to the present invention, compared to other approaches. The efficiency is evaluated in terms of the maximum and averaged extra OFDM symbols required to be transmitted per packet vs. MCS (Modulation Coding Scheme) by averaging over TXVECTOR-HT-LENGTH from 40B-1500B. The x-axis is the MCS index which gives all the different combinations of coding and modulation set. Those MCS set covers all the coding and modulation combination for basic transmission mode.

Figure 4:
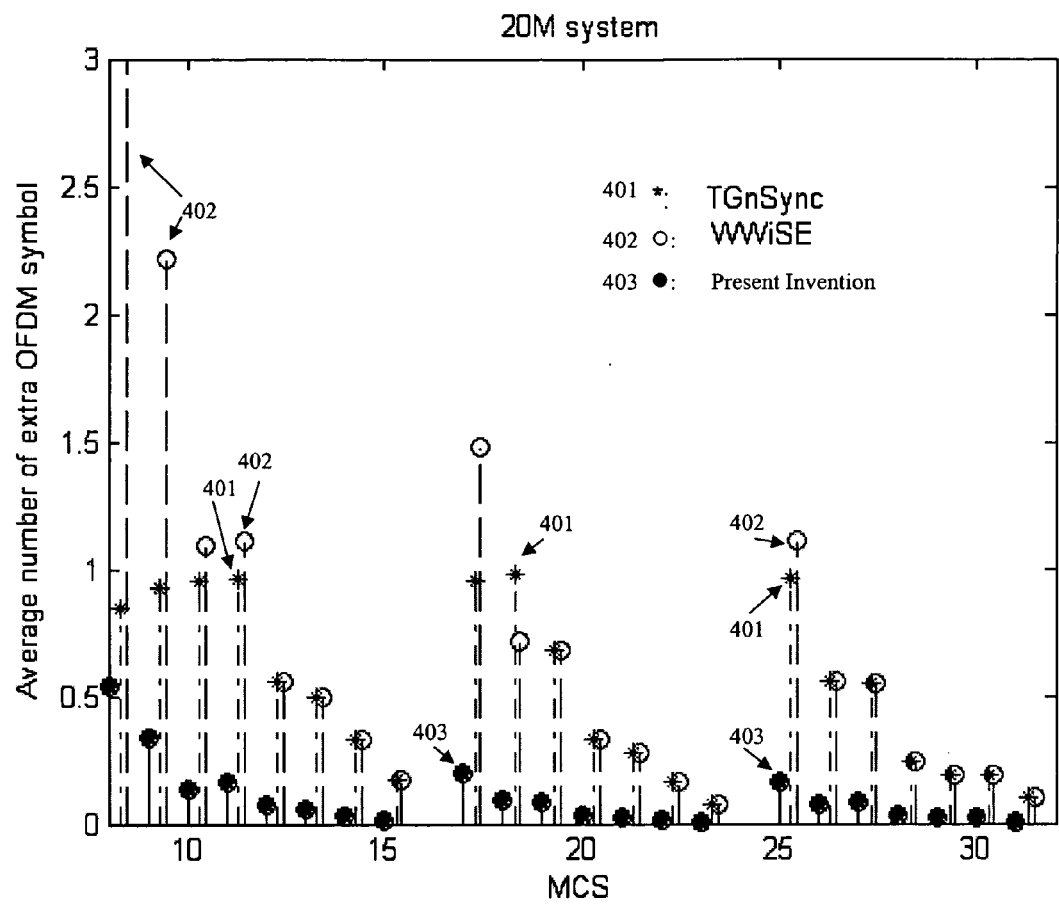
FIG. 4 shows efficiency comparison for a 20 MHz system according to the present invention and existing systems.

FIG. 4 shows example performance efficiency results for a 20 MHz system, wherein: graphs 401 correspond to performance efficiency of the aforementioned TGn Sync approach; graphs 402 correspond to performance efficiency of the aforementioned WWiSE approach; and graphs 403 correspond to performance efficiency of an example embodiment according to the present invention.

Figure 5:
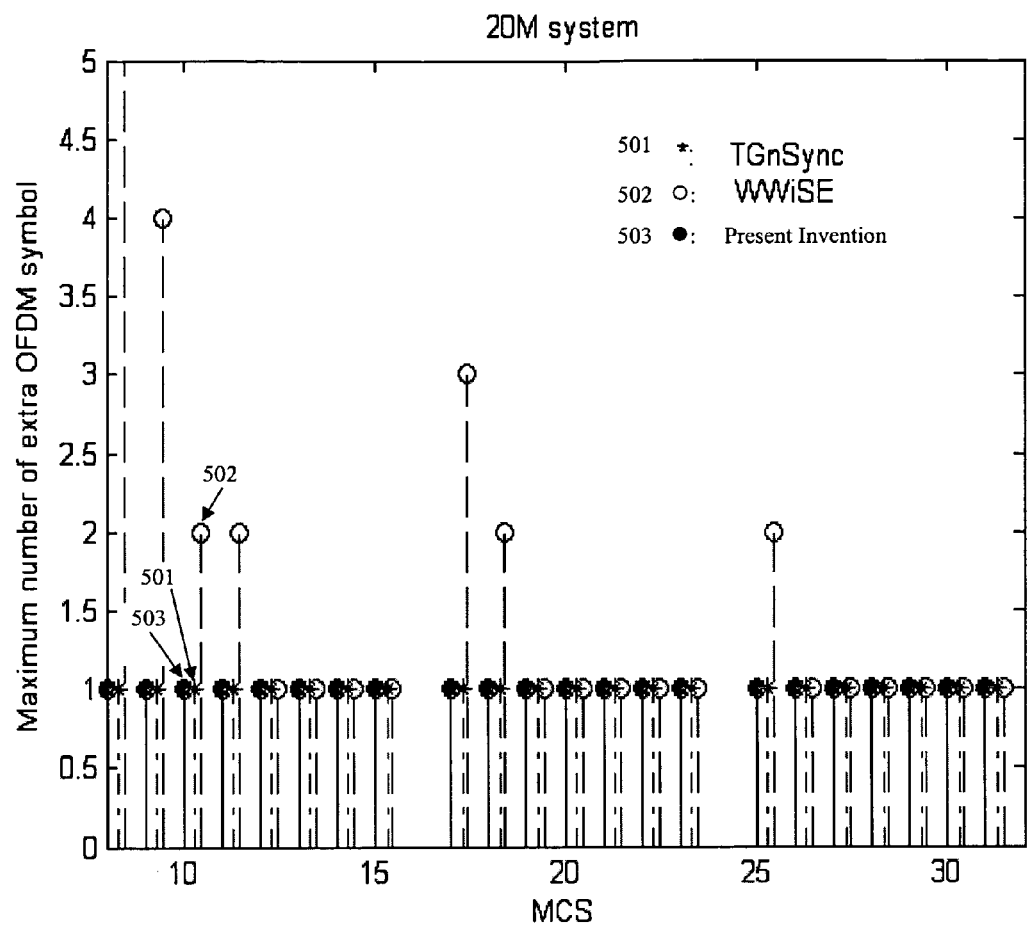
FIG. 5 shows comparison of maximum number of OFDM symbols required for 20 MHz system.
Figure 6:
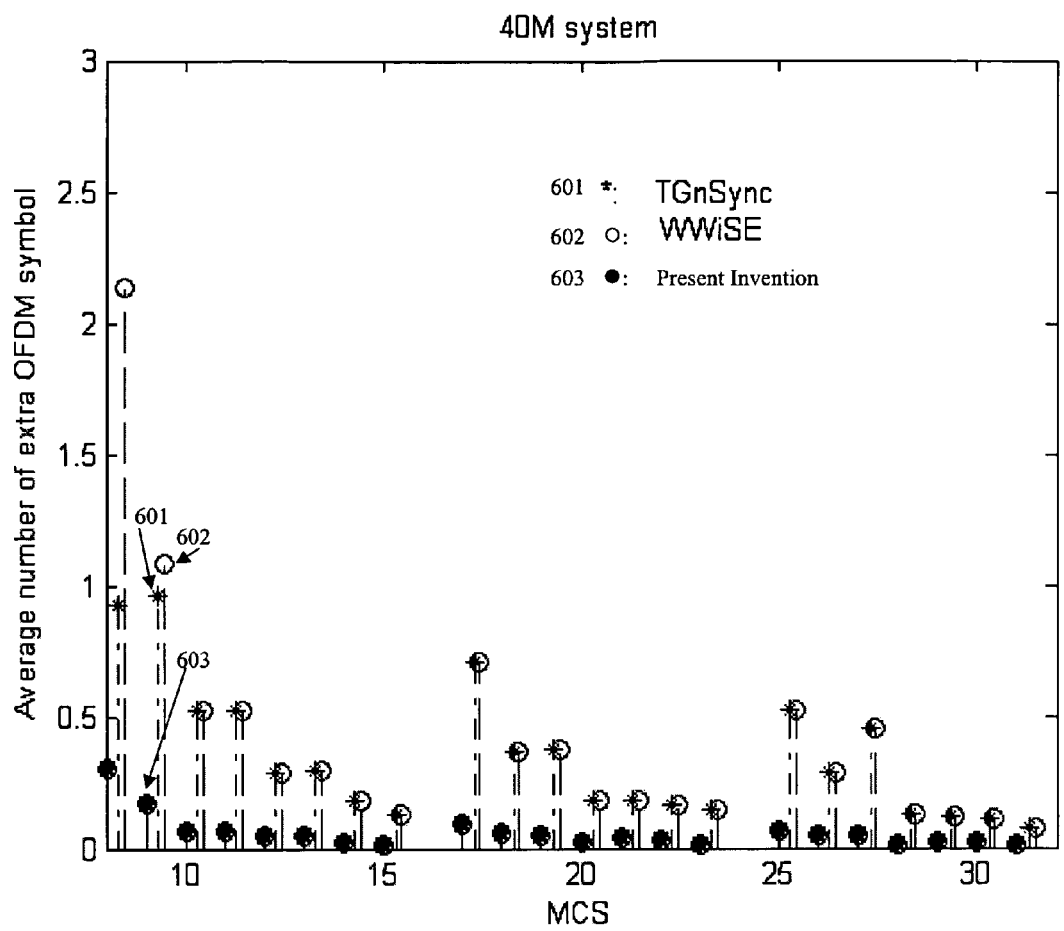
FIG. 6 shows efficiency comparison for a 40 MHz system according to the present invention and existing systems.

FIG. 5 shows the maximum OFDM symbol padding for 20 MHz system, wherein: graphs 501 correspond to performance of the aforementioned TGn Sync approach; graphs 502 correspond to performance of the aforementioned WWiSE approach; and graphs 503 correspond to performance of an example embodiment according to the present invention FIG. 6 shows the efficiency for a 40 MHz system, wherein: graphs 601 correspond to performance of the aforementioned TGn Sync approach; graphs 602 correspond to performance of the aforementioned WWiSE approach; and graphs 603 correspond to performance of an example embodiment according to the present invention.

Figure 7:
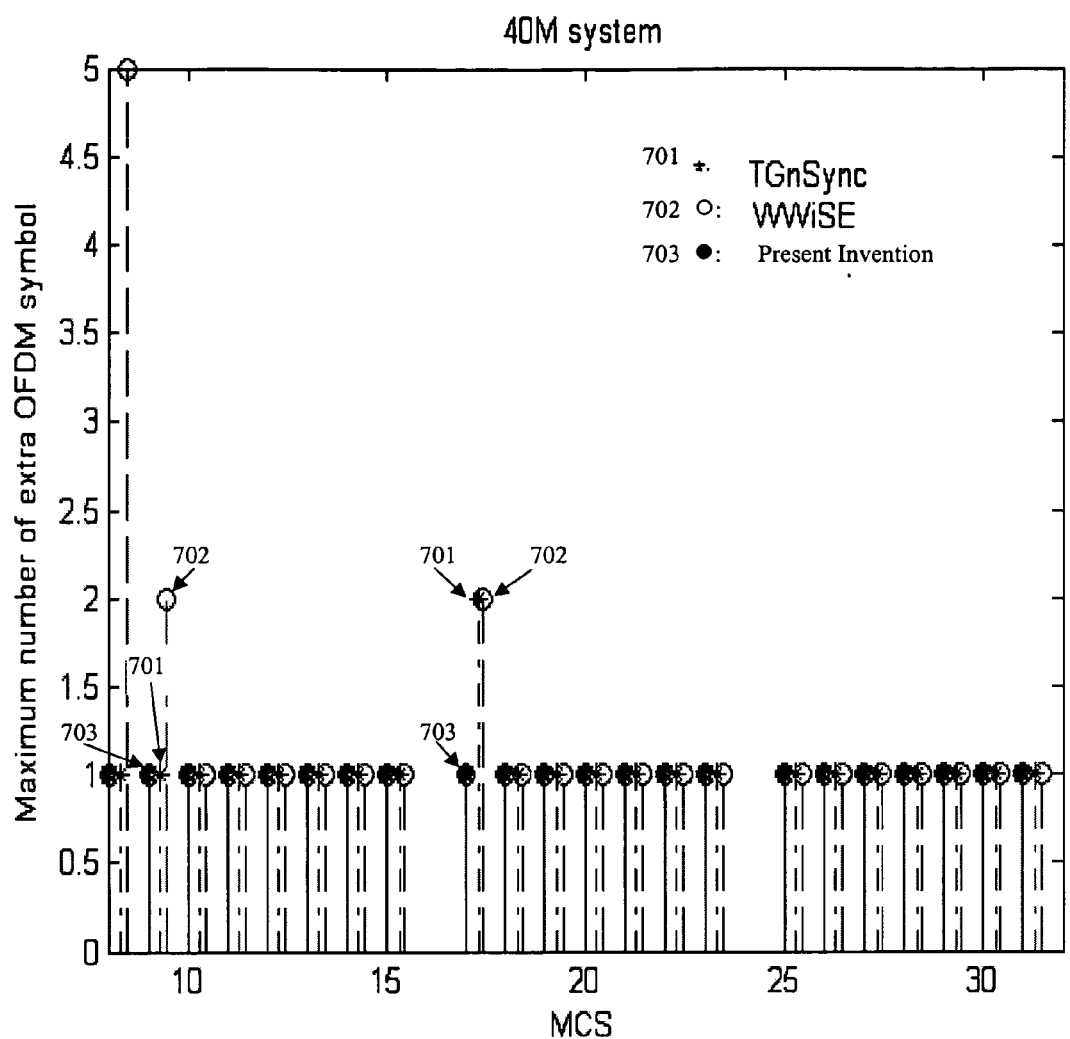
FIG. 7 shows comparison of maximum number of OFDM symbols required for 40 MHz system.

FIG. 7 shows the maximum OFDM symbol padding for 40 MHz system, wherein: graphs 701 correspond to performance of the aforementioned TGn Sync approach; graphs 702 correspond to performance of the aforementioned WWiSE approach; and graphs 703 correspond to performance of an example embodiment according to the present invention.

As illustrated by the results in FIGS. 4-7, the present invention achieves higher efficiency and better coding gain compared with the TGn Sync and WWiSE approaches. While the present invention enjoys similar performance benefit as the modified TGn Sync, the present invention provides a much simpler encoding process.

A shortening/puncturing concatenation rule according to the present invention can be used for low rate transmission, combined with shortening only scheme for high rate transmission. A shortening/puncturing concatenation rule according to the present can also be applied to all data rates for non-aggregation case where the HTLENGTH is specified in octets. As such, a concatenation rule according to the present invention can be applied to all data rates for both aggregate and non-aggregate cases as long as the HTLENGTH is specified in octets.

Accordingly, the present invention provides a simpler LDPC encoding approach wherein encoding parameters are determined using simple calculation instead of exhaustive search. The encoding according to the present invention is further more efficient than the WWiSE and TGn Sync approaches, and provides improved coding performance for very short packet compared with the current TGn Sync approach.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method of concatenation for Low Density Parity Check (LDPC) encoding in an Orthogonal Frequency Division Multiplexing (OFDM) wireless system, comprising:
    selecting codewords based on the data packet payload size, wherein the payload size is the number of transmitted information bits in octets; and
    for transmission rates below a threshold, applying shortening and puncturing across all codewords within the packet to minimize the extra OFDM padding while maintaining the coding performance, and
    for transmission rates above the threshold, applying only shortening across all codewords within the packet to minimize OFDM symbol padding.

2. The method of claim 1 wherein the step of selecting the codewords further includes selecting LDPC block size as an integer number of OFDM tones.

3. The method of claim 1 wherein the step of selecting the codewords further includes selecting the code length based on the number of transmitted information bits in octets.

4. The method of claim 1 wherein the steps of applying shortening and puncturing further includes determining if an additional OFDM symbol padding is to be added based on the number of shortening bits in the last codeword and the available padding bits in the last OFDM symbol.

5. The method of claim 1 wherein the step of selecting the codewords further includes selecting a codeword of the largest possible code size according to the payload size, wherein selecting the largest possible code size essentially guarantees the best code performance as LDPC coding gain increases with increased code size.

6. The method of claim 1 wherein the steps of applying shortening and puncturing further includes:
   determining criterion for applying shortening and puncturing; and
   determining a process to compute a shortening-to-puncturing ratio.

7. The method of claim 1 wherein the applying shortening and puncturing further includes:
   determining if extra OFDM symbols are to be padded to meet said criterion.

8. The method of claim 7 wherein the steps of determining if extra OFDM symbols are to be padded further includes:
   determining if the shortening-to-puncturing ratio is less than a predetermined threshold, and if so, adding an additional OFDM symbol.

9. The method of claim 8 wherein the applying shortening and puncturing further includes:
   determining the exact number of bits to be shortened and to be punctured; and
   computing the total shortening and puncturing bits.

10. The method of claim 9 wherein the steps of applying shortening and puncturing further includes:
    calculating the shortening and puncturing bits per codeword.

11. The method of claim 1 further comprising encoding data packets with the selected codewords, and transmitting the encoded packets to a receiver.

12. The method of claim 11 further comprising decoding the received packets in the receiver to obtain the data packets.

13. A Multiple Input, Multiple Output (MIMO) Orthogonal Frequency Division Multiplexing (OFDM) wireless communication system comprising:
    a transmitter including an Low Density Parity Check (LDPC) encoder that encodes data using LDPC codes, wherein the encoder utilizes concatenation rules for LDPC encoding by: selecting codewords based on the data packet payload size, wherein the payload size is the number of transmitted information bits in octets, and for transmission rates below a threshold the encoder applies shortening and puncturing across all codewords within the packet to minimize the extra OFDM padding while maintaining the coding performance, and for transmission rates above the threshold the encoder applies only shortening across all codewords within the packet to minimize OFDM symbol padding.

14. The system of claim 13 wherein the encoder selects the codewords by selecting LDPC block size as an integer number of OFDM tones.

15. The system of claim 13 wherein the encoder selects the codewords by selecting the code length based on the number of transmitted information bits in octets.

16. The system of claim 13 wherein the encoder applies shortening and puncturing by determining if an additional OFDM symbol padding is to be added based on the number of shortening bits in the last codeword and the available padding bits in the last OFDM symbol.

17. The system of claim 13 wherein the encoder selects the codewords by selecting a codeword of the largest possible code size according to the payload size, wherein selecting the largest possible code size essentially guarantees the best code performance as LDPC coding gain increases with increased code size.

18. The system of claim 13 wherein the encoder applies shortening and puncturing by determining criterion for applying shortening and puncturing, and determining a process to compute a shortening-to-puncturing ratio.

19. The system of claim 13 wherein the encoder applies shortening and puncturing by determining if extra OFDM symbols are to be padded to meet said criterion.

20. The system of claim 19 wherein the encoder determines if extra OFDM symbols are to be padded further by determining if the shortening-to-puncturing ratio is less than a predetermined threshold, and if so, adding an additional OFDM symbol.

21. The system of claim 20 wherein the encoder applies shortening and puncturing further by determine the exact number of bits to be shortened and to be punctured, and computing the total shortening and puncturing bits.

22. The system of claim 21 wherein the encoder applies shortening and puncturing further by calculating the shortening and puncturing bits per codeword.

23. The system of claim 13 wherein the transmitter encodes data packets with the selected codewords, and transmits the encoded packets to a receiver.

24. The system of claim 23 wherein the receiver includes a decoder that decodes the received packets in the receiver to obtain the data packets.

25. A wireless transmitter comprising: a Low Density Parity Check (LDPC) encoder that encodes data using LDPC codes, wherein the encoder utilizes concatenation rules for LDPC encoding by: selecting codewords based on the data packet payload size, wherein the payload size is the number of transmitted information bits in octets, and for transmission rates below a threshold applying shortening and puncturing across all codewords within the packet to minimize the extra OFDM padding while maintaining the coding performance, and for transmission rates above the threshold applying only shortening across all codewords within the packet to minimize OFDM symbol padding.

26. A wireless receiver comprising:
    a decoder that performs Low Density Parity Check (LDPC) decoding by cropping a received packet including transmitted information bits in octets to an N-bit codeword, for the last codeword, if the number of bits is greater than parity bits length (M), the decoder adds padding zeros to the N bits, and decodes the result, otherwise if the number of bits is not greater than parity bits length (M), the decoder adds padding zeros to the end of the N bits without performing decoding, wherein the decoder selects a codeword of the largest possible code size according to the payload size.

27. An Orthogonal Frequency Division Multiplexing (OFDM) wireless system where the packet length is specified in OFDM symbols, comprising:

a transmitter, the transmitter comprising:
- an encoder that performs Low Density Parity Check (LDPC) encoding in the system wherein the payload size is the number of transmitted information bits in octets; and
- a shortening unit coupled to a puncturing unit, wherein for transmission rates below a threshold the shortening unit and puncturing unit apply shortening and puncturing across all codewords within the packet to minimize OFDM symbol padding, and for transmission rates above the threshold the shortening unit applies only shortening across all codewords within the packet to minimize OFDM symbol padding for high transmission rates; and a receiver, the receiver comprising:
- a decoder performs LDPC decoding by cropping a received packet to an N-bit codeword, for the last codeword, if the number of bits is greater than parity bits length (M), the decoder adds padding zeros to the N bits, and decodes the result, otherwise if the number of bits is not greater than parity bits length (M), the decoder adds padding zeros to the end of the N bits without performing decoding.

28. The method of claim 1, wherein the threshold is predetermined.

* * * * *